US012559360B2

(12) United States Patent
Cheng et al.

(10) Patent No.: US 12,559,360 B2
(45) Date of Patent: Feb. 24, 2026

---

(54) MEMS MICROPHONE AND MEMS ACCELEROMETER ON A SINGLE SUBSTRATE

(71) Applicant: Taiwan Semiconductor Manufacturing Company, Ltd., Hsinchu (TW)

(72) Inventors: Chun-Wen Cheng, Zhubei (TW); Chia-Hua Chu, Zhubei (TW); Chun Yin Tsai, Hsinchu (TW); Wen Cheng Kuo, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,741

(22) Filed: Aug. 9, 2023

(65) Prior Publication Data

US 2023/0382716 A1 Nov. 30, 2023

Related U.S. Application Data

(62) Division of application No. 17/352,870, filed on Jun. 21, 2021, now Pat. No. 12,054,383.

(Continued)

(51) Int. Cl.
B81B 3/00 (2006.01)
B81C 1/00 (2006.01)

(52) U.S. Cl.
CPC ........ B81B 3/0021 (2013.01); B81C 1/00246 (2013.01); B81B 2201/0235 (2013.01);
(Continued)

(58) Field of Classification Search
CPC ......... B81B 3/0021; B81B 2201/0235; B81B 2201/0257; B81B 2203/0109;
(Continued)

(56) References Cited

U.S. PATENT DOCUMENTS

| | | | |
|---|---|---|---|
| 2012/0033832 A1* | 2/2012 | van Lippen | H04R 1/245 |
| | | | 381/111 |
| 2014/0264653 A1 | 9/2014 | Cheng et al. | |

(Continued)

FOREIGN PATENT DOCUMENTS

CN 102180435 A 9/2011

OTHER PUBLICATIONS

Notice of Allowance dated Apr. 16, 2024, for U.S. Appl. No. 17/352,870.

(Continued)

*Primary Examiner* — Steven B Gauthier
*Assistant Examiner* — Sun Mi Kim King
(74) *Attorney, Agent, or Firm* — Eschweiler & Potashnik, LLC

(57) ABSTRACT

Various embodiments of the present disclosure are directed towards an electronic device that comprises a semiconductor substrate having a first surface opposite a second surface. The semiconductor substrate at least partially defines a cavity. A first microelectromechanical systems (MEMS) device is disposed along the first surface of the semiconductor substrate. The first MEMS device comprises a first backplate and a diaphragm vertically separated from the first backplate. A second MEMS device is disposed along the first surface of the semiconductor substrate. The second MEMS device comprises spring structures and a moveable element. The spring structures are configured to suspend the moveable element in the cavity. A segment of the semiconductor substrate continuously laterally extends from under a sidewall of the first MEMS device to under a sidewall of the second MEMS device.

20 Claims, 8 Drawing Sheets

Related U.S. Application Data

(60) Provisional application No. 63/160,182, filed on Mar. 12, 2021.

(52) U.S. Cl.
CPC ................. *B81B 2201/0257* (2013.01); *B81B 2203/0109* (2013.01); *B81B 2203/0127* (2013.01); *B81B 2207/015* (2013.01); *B81B 2207/09* (2013.01)

(58) Field of Classification Search
CPC ...... B81B 2203/0127; B81B 2207/015; B81B 2207/09; B81B 7/02; B81B 7/0032; B81C 1/00246; B81C 1/00261
See application file for complete search history.

(56) References Cited

U.S. PATENT DOCUMENTS

| | | | |
|---|---|---|---|
| 2014/0264662 A1 | 9/2014 | Cheng et al. | |
| 2016/0167945 A1* | 6/2016 | Chang ..................... | B81B 3/001 |
| | | | 438/51 |
| 2017/0156002 A1* | 6/2017 | Han ..................... | H04R 31/006 |
| 2017/0355596 A1 | 12/2017 | Gogol | |
| 2018/0146302 A1* | 5/2018 | Chen ..................... | H04R 19/04 |
| 2021/0061641 A1* | 3/2021 | Hu ..................... | B81C 1/00968 |

OTHER PUBLICATIONS

Non-Final Office Action dated Oct. 26, 2023, for U.S. Appl. No. 17/352,870.

\* cited by examiner

1200

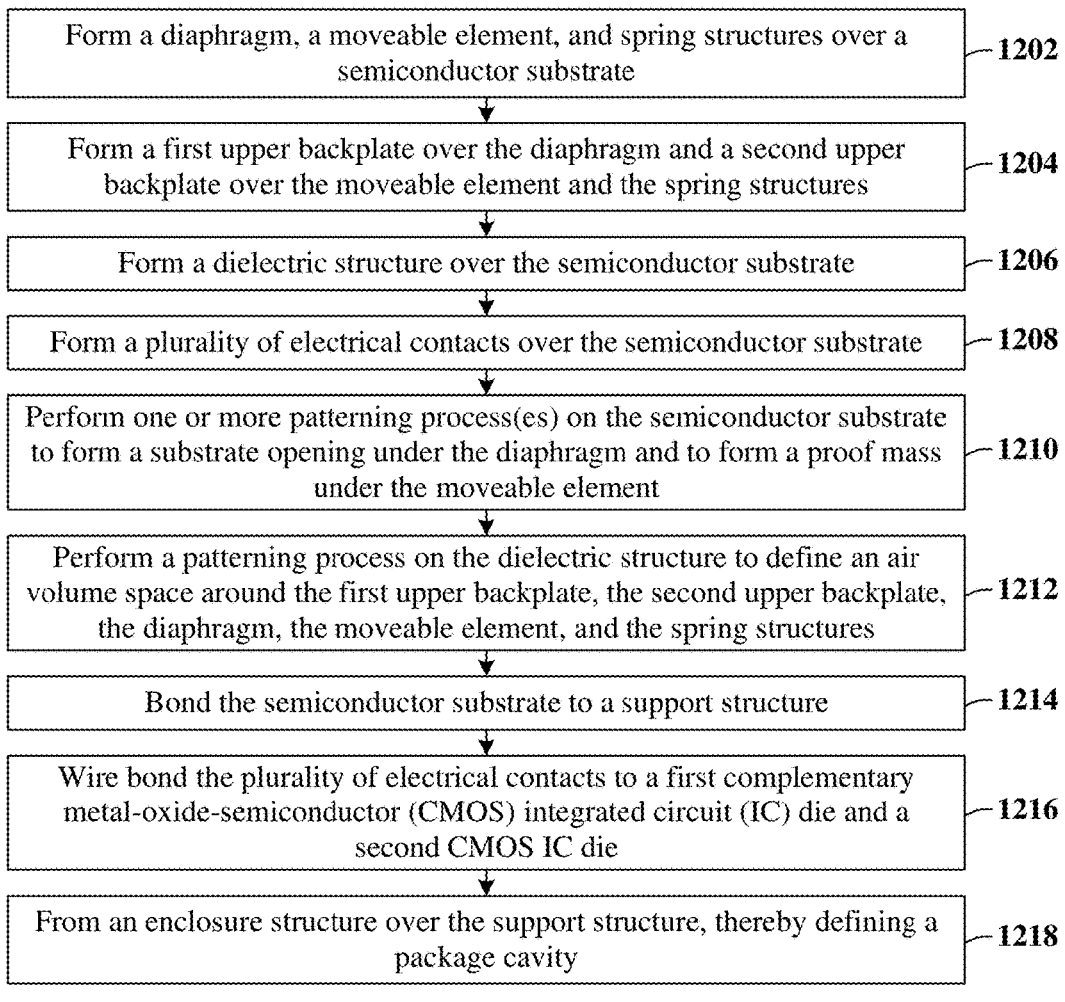

Form a diaphragm, a moveable element, and spring structures over a semiconductor substrate ⟞1202

Form a first upper backplate over the diaphragm and a second upper backplate over the moveable element and the spring structures ⟞1204

Form a dielectric structure over the semiconductor substrate ⟞1206

Form a plurality of electrical contacts over the semiconductor substrate ⟞1208

Perform one or more patterning process(es) on the semiconductor substrate to form a substrate opening under the diaphragm and to form a proof mass under the moveable element ⟞1210

Perform a patterning process on the dielectric structure to define an air volume space around the first upper backplate, the second upper backplate, the diaphragm, the moveable element, and the spring structures ⟞1212

Bond the semiconductor substrate to a support structure ⟞1214

Wire bond the plurality of electrical contacts to a first complementary metal-oxide-semiconductor (CMOS) integrated circuit (IC) die and a second CMOS IC die ⟞1216

From an enclosure structure over the support structure, thereby defining a package cavity ⟞1218

Fig. 12

MEMS MICROPHONE AND MEMS ACCELEROMETER ON A SINGLE SUBSTRATE

REFERENCE TO RELATED APPLICATIONS

This application is a Divisional of U.S. application Ser. No. 17/352,870, filed on Jun. 21, 2021, which claims the benefit of U.S. Provisional Application No. 63/160,182, filed on Mar. 12, 2021. The contents of the above-referenced patent applications are hereby incorporated by reference in their entirety.

BACKGROUND

Microelectromechanical systems (MEMS) devices, such as accelerometers, pressure sensors, and microphones, have found widespread use in many modern-day electronic devices. MEMS devices may have a movable part, which is used to detect a motion, and convert the motion to electrical signal. For example, MEMS accelerometers and MEMS microphones are commonly found in automobiles (e.g., in airbag deployment systems), tablet computers, or in smart phones. A MEMS accelerometer includes a movable part that transfer the accelerating movement to an electrical signal. A MEMS microphone includes a movable membrane that transfer the sound to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 illustrates a methodology in flowchart format that illustrates some embodiments of a method of forming an electronic device having a first MEMS device and a second MEMS device disposed on a semiconductor substrate.

DETAILED DESCRIPTION

Figure 1:
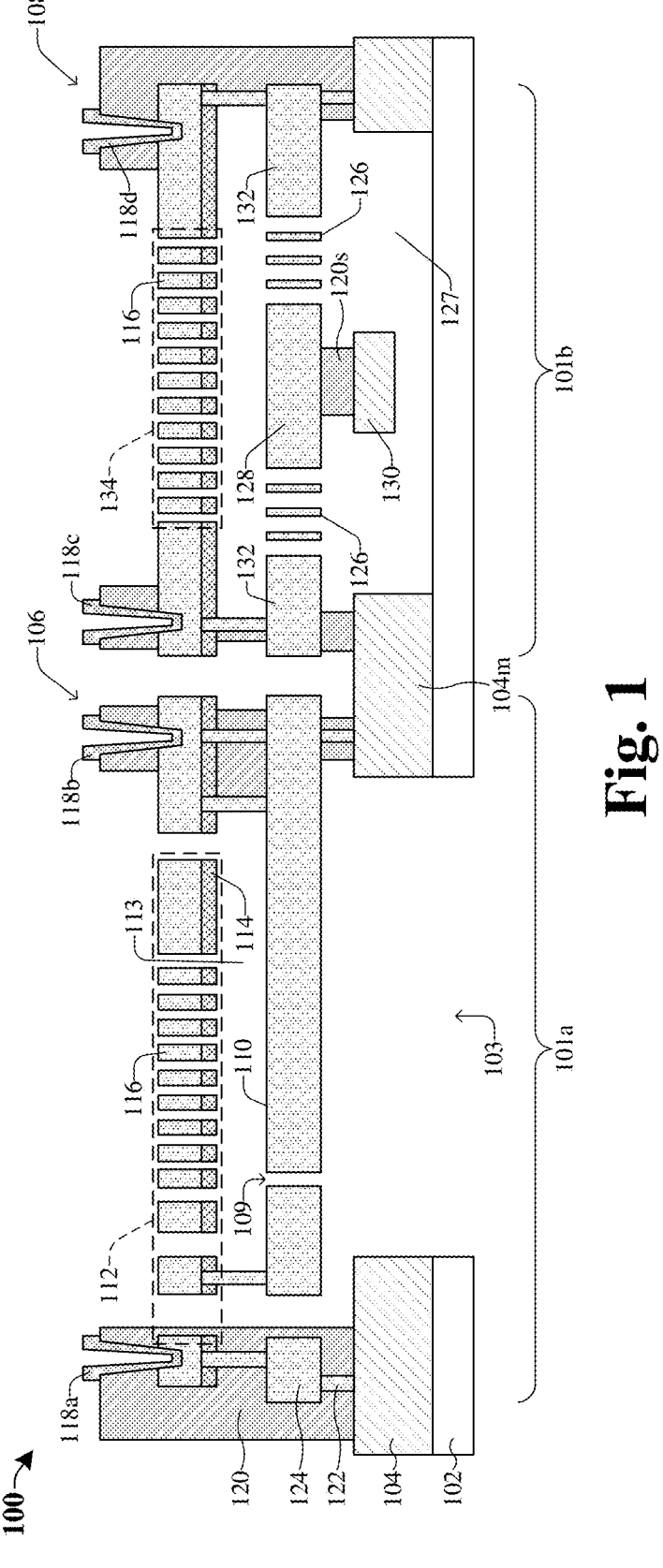
FIG. 1 illustrates a cross-sectional view of some embodiments of an electronic device having a first microelectromechanical system (MEMS) device and a second MEMS device disposed on a semiconductor substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Electronic devices may include multiple microelectromechanical system (MEMS) devices housed within a package structure. For example, a first MEMS device may be configured as a microphone and/or speaker and a second MEMS device may be configured as an accelerometer (e.g., a voice accelerometer). The package structure has an opening (i.e., an inlet) and is configured to provide protection of the first and second MEMS devices while the opening allows for sound waves to reach a cavity of the package structure holding the first and second MEMS devices. The first MEMS device has moveable parts directly overlying the opening of the package structure. The second MEMS device includes one or more springs and a moveable element disposed within the cavity and overlying a surface of the package structure that is laterally offset from the opening. Further, within the package structure, the first MEMS device may be electrically coupled to a first application-specific integrated circuit (ASIC) disposed within the cavity and the second MEMS device may be electrically coupled to a second ASIC disposed within the cavity. The first ASIC is configured to control and/or receive electrical signals from the first MEMS device and the second ASIC is configured to control and/or receive electrical signals from the second MEMS device.

One approach to fabricating an electronic device having the first MEMS device and the second MEMS device is to form the first MEMS device separate from forming the second MEMS device. For example, the first MEMS device may be fabricated with moveable elements on a first substrate, and the second MEMS device may be fabricated with one or more springs and a moveable element on a second substrate separate from the first substrate. Further, the first ASIC may be fabricated with first semiconductor devices (e.g., transistors) and the second ASIC may be fabricated with second semiconductor devices (e.g., transistors). A package substrate may be provided to integrate the first and second MEMS devices and the first and second ASICs. However, by forming the first MEMS device separate from the second MEMS device, time and costs associated with forming the electronic device are significantly increased. Further, individually forming the second MEMS device along the second substrate may increase a number of bonding process performed to fabricate the electronic device. This increases a difficulty of the fabrication process and may result in damage to the second MEMS device.

The present disclosure, in some embodiments, relates to a method that simplifies the fabrication of an electronic device comprising a first MEMS device and a second MEMS device. The method includes forming the first MEMS device and the second MEMS device along a single substrate. For example, the first MEMS device may be formed concurrently with the second MEMS device along the substrate. Subsequently, the substrate may be attached (e.g., bonded) to a support structure (e.g., a carrier substrate) such that the first MEMS device overlies an opening in the support structure and the second MEMS device is laterally offset from the opening. This method reduces a number of processing steps (e.g., reduces a number of bonding process performed) utilized to form the first and second MEMS devices individually, thereby decreasing time, difficultly, and costs associated with fabrication of the electronic device. Further, forming the first and second MEMS devices on the single substrate may increase a structural integrity of the first and second MEMS devices, thereby reducing damage to the MEMS devices.

FIG. 1 illustrates a cross-sectional view of some embodiments of an electronic device 100 having a first microelectromechanical system (MEMS) device 106 and a second MEMS device 108 disposed on a semiconductor substrate 104.

The semiconductor substrate 104 overlies a support structure 102 (e.g., may be referred to as a carrier substrate or package substrate). The first MEMS device 106 is disposed within a first device region 101a of the semiconductor substrate 104 and the second MEMS device 108 is disposed within a second device region 101b that is laterally adjacent to the first device region 101a. A dielectric structure 120 overlies the semiconductor substrate 104. A plurality of conductive wires 124 and a plurality of conductive vias 122 are disposed within the dielectric structure 120 and are configured to electrically couple devices (e.g., the first and second MEMS devices 106, 108) to one another and/or to other semiconductor devices (not shown). In various embodiments, the first MEMS device 106 is configured as a MEMS microphone and/or a MEMS speaker, and the second MEMS device 108 is configured as an accelerometer or a voice accelerometer, such that the first MEMS device 106 is different from the second MEMS device 108. In various embodiments, a middle segment 104m of the semiconductor substrate 104 continuously laterally extends from the first device region 101a to the second device region 101b.

In some embodiments, the first MEMS device 106 has a first MEMS structure that includes a first upper backplate 112 and a diaphragm 110 disposed between the first upper backplate 112 and the semiconductor substrate 104. The diaphragm 110 is spaced apart from the first upper backplate 112 by a non-zero distance. Further, the diaphragm 110 and the first upper backplate 112 can be electrically conductive, which forms a capacitive element. In some embodiments, a plurality of electrical contacts 118a-d overlie the semiconductor substrate 104 and are electrically coupled to the first and second MEMS devices 106, 108. In various embodiments, a first electrical contact 118a is electrically coupled to the first upper backplate 112 and forms a first terminal for the capacitive element, and a second electrical contact 118b is electrically coupled to the diaphragm 110 and forms a second terminal for the capacitive element. In some embodiments, the electrical coupling is achieved through the conductive wires 124 and the conductive vias 122.

The diaphragm 110 includes one or more diaphragm openings 109 and may be anchored by the dielectric structure 120 at multiple points. Anchoring the diaphragm 110 at the multiple points allow a boundary of the diaphragm 110 to be fixed relative to the first upper backplate 112. The diaphragm 110 is deformable by energy of sound waves to make the diaphragm 110 bend towards or away from the first upper backplate 112, as the sound waves exert pressure on the first upper backplate 112 through a substrate opening 103 in the semiconductor substrate 104 and/or the support structure 102. The semiconductor substrate 104 and the support structure 102 each have sidewalls defining the substrate opening 103. The first upper backplate 112 comprises a plurality of openings by which air may pass through. There is an air volume space 113 between the first upper backplate 112 and the diaphragm 110. Air can get out of or get into the air volume space 113 through air passage ways formed by the plurality of openings in the first upper backplate 112 and/or through the one or more diaphragm openings 109. The air travels out of or into the air volume space 113 as the diaphragm 110 bends towards or away from the first upper backplate 112. The bending movement of the diaphragm 110 relative to the first upper backplate 112 by the sound waves changes the capacitance of the capacitive element between the diaphragm 110 and the first upper backplate 112. Such change of the capacitance can be provided to external circuitry (not shown) configured to measure the capacitance by way of the first and second electrical contacts 118a, 118b. The measured capacitance can be translated into an acoustical signal corresponding to sound waves that cause movement of the air.

In further embodiments, the second MEMS device 108 has a second MEMS structure that includes a moveable element 128, spring structures 126, and a second upper backplate 134. The spring structures 126 each extend from an anchor structure 132 to the moveable element 128 and are configured to suspend the moveable element 128 within a cavity 127 and over the support structure 102. In some embodiments, the cavity 127 is defined between the support structure 102 and the second upper backplate 134. In addition, a proof mass 130 is connected to the moveable element 128 by way of a segment 120s of the dielectric structure 120. The proof mass 130 is suspended within the cavity 127. During operation, the proof mass 130 and/or the moveable element 128 deflect(s) in proportion to external stimuli, such as motion or sound waves, applied to the moveable element 128 and/or the proof mass 130, whereby the external stimuli can be quantified by measuring the deflection. In some embodiments, the deflection is measured using capacitive coupling between the moveable element 128 and a fixed sensing electrode (not shown) neighboring the proof mass 130 (e.g., where the fixed sensing electrode is disposed a surface of the support structure 102 and abuts the cavity 127). In yet further embodiments, the moveable element 128 and the second upper backplate 134 are conductive and may be electrically coupled to a third electrical contact 118c and/or a fourth electrical contact 118d by way of the plurality of conductive wires 124 and the plurality of conductive vias 122. Thus, the deflection may be measured using capacitive coupling between the second upper backplate 134 and the moveable element 128. In such embodiments, the moveable element 128 may be configured as a moveable sensing electrode and the second upper backplate 134 may be configured as a fixed sensing electrode. The third and fourth electrical contacts 118c, 118d may be configured to facilitate measuring the change in capacitance between the second upper backplate 134 and the moveable element 128.

In addition, by virtue of the proof mass 130 being connected to the moveable element 128 by way of the segment 120s of the dielectric structure 120 a sensitivity of the second MEMS device 108 may be increased. For example, when external stimuli (such as motion or sound wave) is applied to the second MEMS device 108 the proof mass 130 deflects in proportion to the external stimuli and in turn causes the moveable element 128 to deflect such that the deflection is measured using capacitive coupling between the moveable element 128 and the second upper backplate 134. In yet further embodiments, if the proof mass 130 is omitted (not shown) then the moveable element 128 will not deflect to relatively small external stimuli and/or may take longer to begin deflection in response to the external stimuli. Thus, the proof mass 130 increases a size and weight of the one or more moveable structure(s) (i.e., sensing structure(s)) of the second MEMS device 108, thereby increasing the sensitivity and performance of the second MEMS device 108. In some embodiments, the second upper backplate 134 is configured to be rigid or stationary such that deflection of the second upper backplate 134 in response to the external stimuli is minimal or the second upper backplate 134 does not deflect in response to the external stimuli.

In various embodiments, the first and second upper backplates 112, 134 respectively comprise a conductive layer 116 overlying an anti-stiction layer 114. The anti-stiction layer 114 may, for example, be configured to prevent stiction between the first and second upper backplates 112, 134 and underlying layers and/or structures (e.g., such as the diaphragm 110 or the moveable element 128), thereby increasing a performance and endurance of the first and second MEMS devices 106, 108.

In some embodiments, during fabrication of the electronic device 100, the first MEMS device 106 is formed concurrently with the second MEMS device 108 over the semiconductor substrate 104. For example, the diaphragm 110, the spring structures 126, and the moveable element 128 may be formed concurrently with one another, and the first and second upper backplates 112, 134 may be formed concurrently with one another. Subsequently, the semiconductor substrate 104 may be attached (e.g., bonded) to the support structure 102 such that the first MEMS device 106 directly overlies the substrate opening 103 in the support structure 102. This, in part, reduces a number of processing steps utilized to form the first and second MEMS devices 106, 108, thereby decreasing time and costs associated with fabricating the electronic device 100. Further, forming the first and second MEMS devices 106, 108 on the semiconductor substrate 104 may increase a structural integrity of the first and second MEMS devices 106, 108, thereby increasing an endurance of the electronic device 100.

Figure 2:
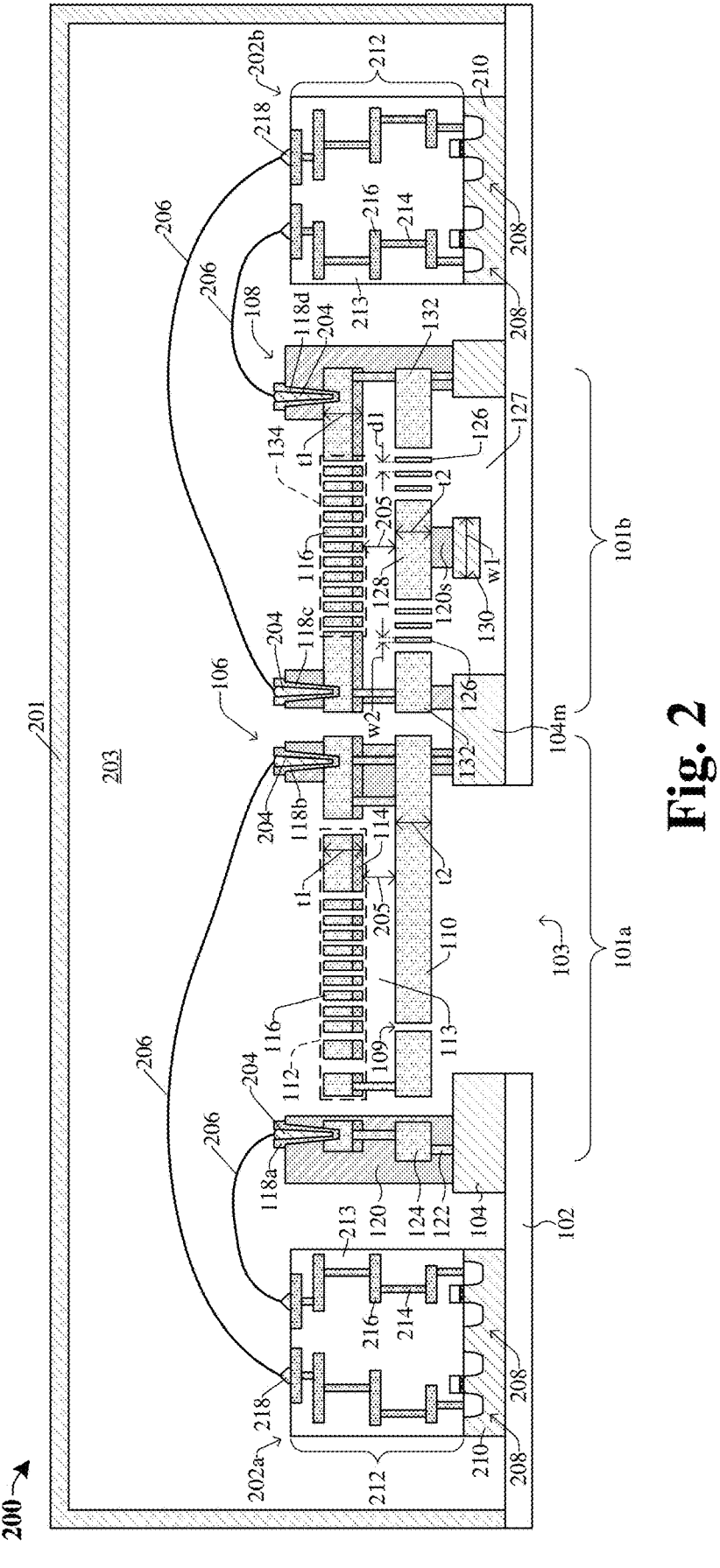
FIG. 2 illustrates a cross-sectional view of some embodiments of an electronic device having a first MEMS device wire bonded to a first complementary metal-oxide-semiconductor (CMOS) integrated circuit (IC) die and a second MEMS device wire bonded to a second CMOS IC die.

FIG. 2 illustrates a cross-sectional view of some embodiments of an integrated chip 200 having the first MEMS device 106 wire bonded to a first complementary metal-oxide-semiconductor (CMOS) integrated circuit (IC) die 202a and the second MEMS device 108 wire bonded to a second CMOS IC die 202b.

The integrated chip 200 includes the first MEMS device 106 laterally adjacent to the second MEMS device 108 and both disposed on the semiconductor substrate 104. The first and second MEMS devices 106, 108 are disposed within a package structure that includes the support structure 102 (e.g., carrier substrate) and an enclosure structure 201. The package structure defines a package cavity 203, where the first and second MEMS devices 106, 108 are disposed within and abut the package cavity 203. The first and second CMOS IC dies 202a, 202b may each be configured as an application-specific integrated circuit (ASIC) that is configured to control and/or receive electrical signals from the first and second MEMS devices 106, 108, respectively. The first and second MEMS devices 106, 108 and the first and second CMOS IC dies 202a, 202b are disposed on the support structure 102. In some embodiments, a package opening (i.e., an inlet) to the package structure may be the substrate opening 103 of the first MEMS device 106, such that any air entering or leaving the package cavity 203 passes through the first MEMS device 106.

The first and second CMOS IC dies 202a, 202b respectively include a CMOS substrate 210, a back-end-of-line (BEOL) metallization stack 212 overlying the CMOS substrate 210, a plurality of bond pads 218 overlying the BEOL metallization stack 212, and a plurality of semiconductor devices 208 disposed on/over the CMOS substrate 210. In some embodiments, the BEOL metallization stack 212 includes a BEOL dielectric structure 213, a plurality of interconnect wires 216, and a plurality of interconnect vias 214. The interconnect wires 216 and the interconnect vias 214 are disposed within the BEOL dielectric structure 213 and are configured to provide electrical connections to the plurality of semiconductor devices 208. In various embodiments, the CMOS substrate 210 and the BEOL metallization stack 212 include electronic components such as the semiconductor devices 208 (e.g., transistors), and/or other electronic components (not shown), such as one or more capacitors, resistors, inductors, diodes, memory devices, other electronic components, or any combination of the foregoing. The BEOL dielectric structure 213 may comprise one or more dielectric layers, which may respectively comprise a low-k dielectric (e.g., a dielectric material with a dielectric constant less than about 3.9), an oxide (e.g., silicon dioxide), another dielectric material, or any combination of the foregoing. In further embodiments, the interconnect vias and wires 214, 216 may, for example, respectively be or comprise aluminum, copper, tungsten, ruthenium, titanium, tantalum nitride, titanium nitride, another conductive material, or any combination of the foregoing.

In various embodiments, a solder ball 204 is disposed over each electrical contact in the plurality of electrical contacts 118a-d. The solder balls 204 provide contact points for a plurality of bond wires 206. The plurality of bond pads 218 overlies a top layer of the interconnect wires 216 in the BEOL metallization stack 212 and provides a wire bonding location for the bond wires 206. In further embodiments, the semiconductor devices 208 are electrically coupled to the plurality of electrical contacts 118a-d by way of the BEOL metallization stack 212, the bond wires 206, and the bond pads 218. In yet further embodiments, the first CMOS IC die 202a is configured to provide electrical signals (e.g., control signals) to the first MEMS device 106 and/or receive electrical signals from the first MEMS device 106, and the second CMOS IC die 202b is configured to provide electrical signals (e.g., control signals) to the second MEMS device 108 and/or receive electrical signals from the second MEMS device 108. The first CMOS IC die 202a is configured to switch the first MEMS device 106 between an on state and an off state and the second CMOS IC die 202b is configured to switch the second MEMS device 108 between an on state and an off state.

In some embodiments, when the second MEMS device 108 (e.g., voice accelerometer) detects movement of the moveable element 128 and/or the proof mass 130 in response to external stimuli (e.g., motion, vibration, sound waves, etc.) then the first CMOS IC die 202a and/or the second CMOS IC die 202b is/are configured to switch the first MEMS device 106 (e.g., MEMS microphone) to the on state. Further, when the second MEMS device 108 (e.g., voice accelerometer) has not detected movement of the moveable element 128 and/or the proof mass 130 for a set duration of time then the first CMOS IC die 202a and/or the second CMOS IC die 202b is/are configured to switch the first MEMS device 106 (e.g., MEMS microphone) to the off state. Thus, the first MEMS device 106 (e.g., MEMS microphone) may be switched off when the second MEMS device 108 has not detected motion, vibration, and/or sound waves, thereby reducing power consumption of the integrated chip 200. Further, the integrated chip 200 may be switched between the on state and the off state based on the detection of movement by the second MEMS device 108 as described above, thereby further decreasing power consumption of the integrated chip 200. In addition, by virtue of the proof mass 130 increasing sensitivity of the second MEMS device 108, a power state of the first MEMS device 106 may be set more quickly and accurately, thereby increasing a performance of the integrated chip 200.

In various embodiments, the semiconductor substrate 104 comprises silicon, monocrystalline silicon, bulk silicon, another semiconductor material, or the like. In further embodiments, the proof mass 130 is part of the semiconductor substrate 104 and comprises a same material (e.g., monocrystalline silicon) as the semiconductor substrate 104. Further, the diaphragm 110, the conductive vias 122, the conductive wires 124, the anchor structures 132, the spring structures 126, and the moveable element 128 may, for example, be or comprise polysilicon, aluminum nitride, lead zirconate titanate (PZT), another suitable material, or any combination of the foregoing. The anti-stiction layer 114 may comprise a first material (e.g., silicon nitride) and the conductive layer 116 may comprise a second material (e.g., polysilicon, aluminum nitride, PZT, etc.) different than the first material. The dielectric structure 120 may, for example, be or comprise one or more dielectric layers that may respectively comprise a low-k dielectric material, an oxide (e.g., such as silicon dioxide), another dielectric material, or any combination of the foregoing. Further, the plurality of electrical contacts 118a-d may, for example, be or comprise aluminum, copper, titanium nitride, tungsten, gold, another suitable conductive material, or any combination of the foregoing.

In some embodiments, the first and second upper backplates 112, 134 respectively have a first thickness t1 that is within a range of about 0.1 micrometers (um) to about 1 um, less than about 1 um, or another suitable value. In further embodiments, the diaphragm 110, the spring structures 126, and/or the moveable element 128 respectively have a second thickness t2 that is about 0.3 um to about 4 um, less than about 4 um, or another suitable value. Further, a sensing gap 205 defined between the diaphragm 110 and the first upper backplate 112 and defined between the moveable element 128 and the second upper backplate 134 is within a range of about 1 um to about 10 um, less than about 10 um, or another suitable value. In yet further embodiments, a first width w1 of the proof mass 130 is within a range of about 10 um to about 900 um, or another suitable value. In various embodiments, if the first width w1 of the proof mass 130 is relatively small (e.g., less than about 10 um), then a size of the proof mass 130 is relatively small and the sensitivity of the second MEMS device 108 is reduced thereby mitigating an overall performance of the integrated chip 200. In yet further embodiments, if the first width w1 of the proof mass is relatively large (e.g., greater than about 900 um), then a size of the proof mass 130 is increased and may be more susceptible to becoming stuck to sidewalls of the semiconductor substrate 104 and/or surfaces of the support structure 102. This, in part, may prevent the second MEMS device 108 from detecting external stimuli, thereby decreasing a performance of the integrated chip 200.

In some embodiments, a second width w2 of each segment of the spring structures 126 may be within a range of about 0.1 um to about 3 um, less than about 3 um, or another suitable value. In various embodiments, a distance d1 between adjacent segments of the spring structures 126 may be within a range of about 2 um to about 6 um, greater than about 2 um, or another suitable value. In yet further embodiments, although the first MEMS device 106 may be configured as a MEMS microphone comprising a single backplate (e.g., the first upper backplate 112) disposed above the diaphragm 110, it will be appreciated that the first MEMS device 106 may be configured as a MEMS microphone comprising two backplates such that the first MEMS device 106 further comprises a first lower backplate (not shown) disposed between the diaphragm 110 and the semiconductor substrate 104.

FIGS. 3-11 illustrate cross-sectional views 300-1100 of some embodiments of a method of forming an electronic device having a first microelectromechanical system (MEMS) device and a second MEMS device disposed on a semiconductor substrate according to the present disclosure. Although the cross-sectional views 300-1100 shown in FIGS. 3-11 are described with reference to a method, it will be appreciated that the structures shown in FIGS. 3-11 are not limited to the method but rather may stand alone separate of the method. Furthermore, although FIGS. 3-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figures 3, 4:
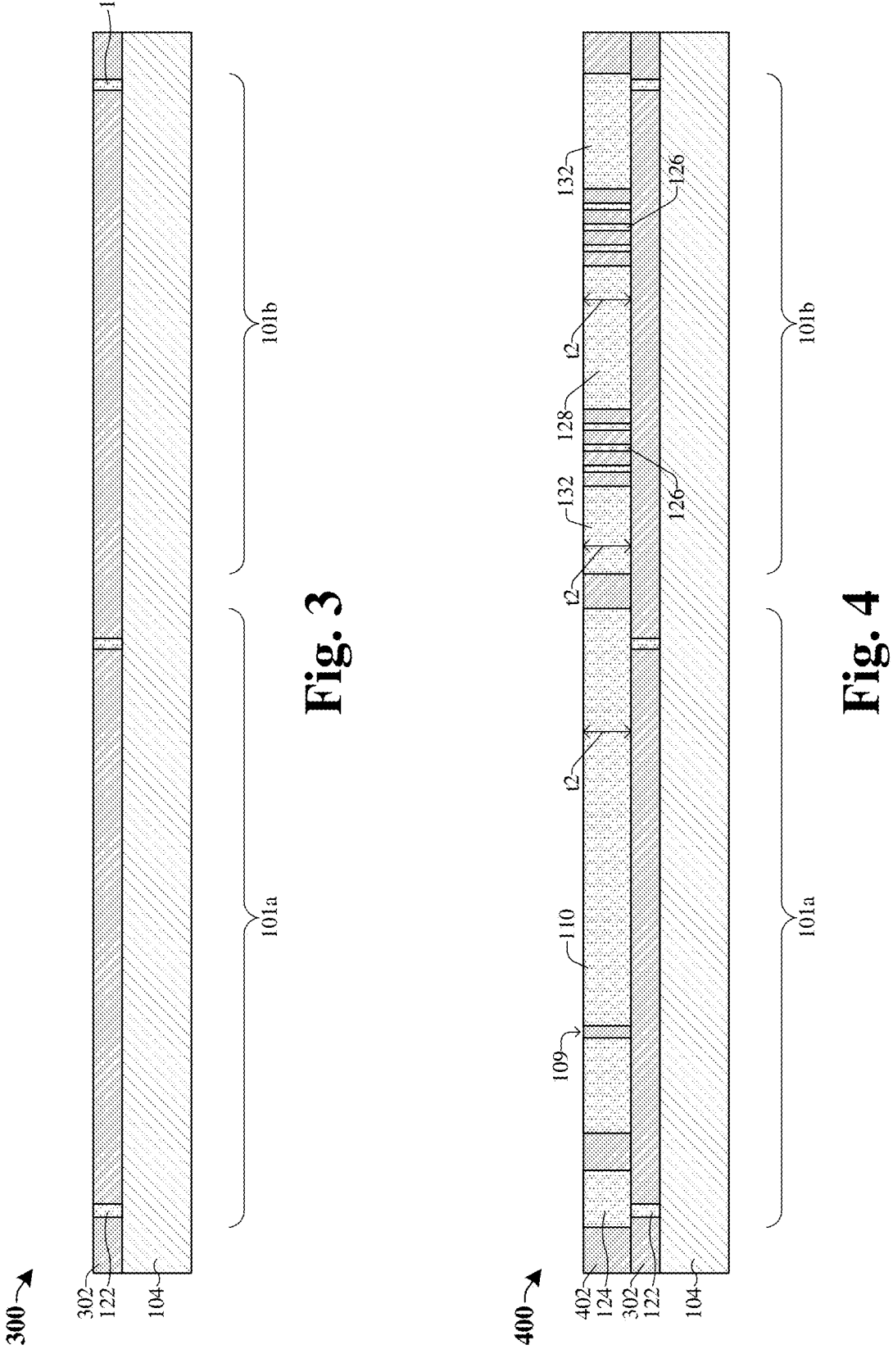
FIGS. 3-11 illustrate cross-sectional views of some embodiments of a method of forming an electronic device having a first MEMS device and a second MEMS device disposed on a semiconductor substrate.

As shown in cross-sectional view 300 of FIG. 3, a first dielectric layer 302 is formed over a semiconductor substrate 104 and a first layer of a plurality of conductive vias 122 is formed within the first dielectric layer 302. The first dielectric layer 302 may be deposited over the semiconductor substrate 104 by chemical vapor deposition (CVD), physical vapor deposition (PVD), atomic layer deposition (ALD), or another suitable deposition or growth process. In various embodiments, a process for forming the first layer of the plurality of conductive vias 122 includes: forming a masking layer (not shown) over the first dielectric layer 302; patterning the first dielectric layer 302 according to the masking layer to define a plurality of via openings within the first dielectric layer 302; depositing a conductive material (e.g., polysilicon) within the via openings; and performing a planarization process (e.g., a chemical-mechanical planarization (CMP) process) into the conductive material. In various embodiments, the conductive material is deposited by CVD, PVD, sputtering, electro plating, electroless plating, or another suitable deposition or growth process. In yet further embodiments, the planarization process may be performed such that a top surface of the first dielectric layer 302 and top surfaces of the conductive vias 122 are coplanar.

As shown in cross-sectional view 400 of FIG. 4, a second dielectric layer 402 is formed over the first dielectric layer 302. Further, a first layer of a plurality of conductive wires 124, a diaphragm 110, anchor structures 132, spring structures 126, and a moveable element 128 are formed over the first dielectric layer 302. The diaphragm 110 is disposed within a first device region 101a of the semiconductor substrate 104, and the anchor structures 132, the spring structures 126, and the moveable element 128 are disposed laterally within a second device region 101b of the semiconductor substrate 104.

In various embodiments, a process for forming the first layer of the plurality of conductive wires 124, the diaphragm 110, the anchor structures 132, the spring structures 126, and the moveable element 128 includes: depositing (e.g., by CVD, PVD, sputtering, electroplating, electroless plating, etc.) a conductive material (e.g., aluminum nitride, PZT, polysilicon, or the like) over the first dielectric layer 302; forming a masking layer (not shown) over the conductive material; and patterning the conductive material according to the masking layer to define the first layer of the plurality of conductive wires 124, the diaphragm 110, the anchor structures 132, the spring structures 126, and the moveable element 128. Further, the second dielectric layer 402 may be deposited over the conductive wires 124, the diaphragm 110, the anchor structures 132, the spring structures 126, and the moveable element 128 by CVD, PVD, ALD, or another suitable growth or deposition process. In further embodiments, the diaphragm 110, the anchor structures 132, the spring structures 126, and the moveable element 128 may respectively be formed with a second thickness t2 that is about 0.3 um to about 4 um, less than about 4 um, or another suitable value. In some embodiments, the first layer of the plurality of conductive wires 124, the diaphragm 110, the anchor structures 132, the spring structures 126, and the moveable element 128 are formed concurrently with one another.

Figures 5, 6:
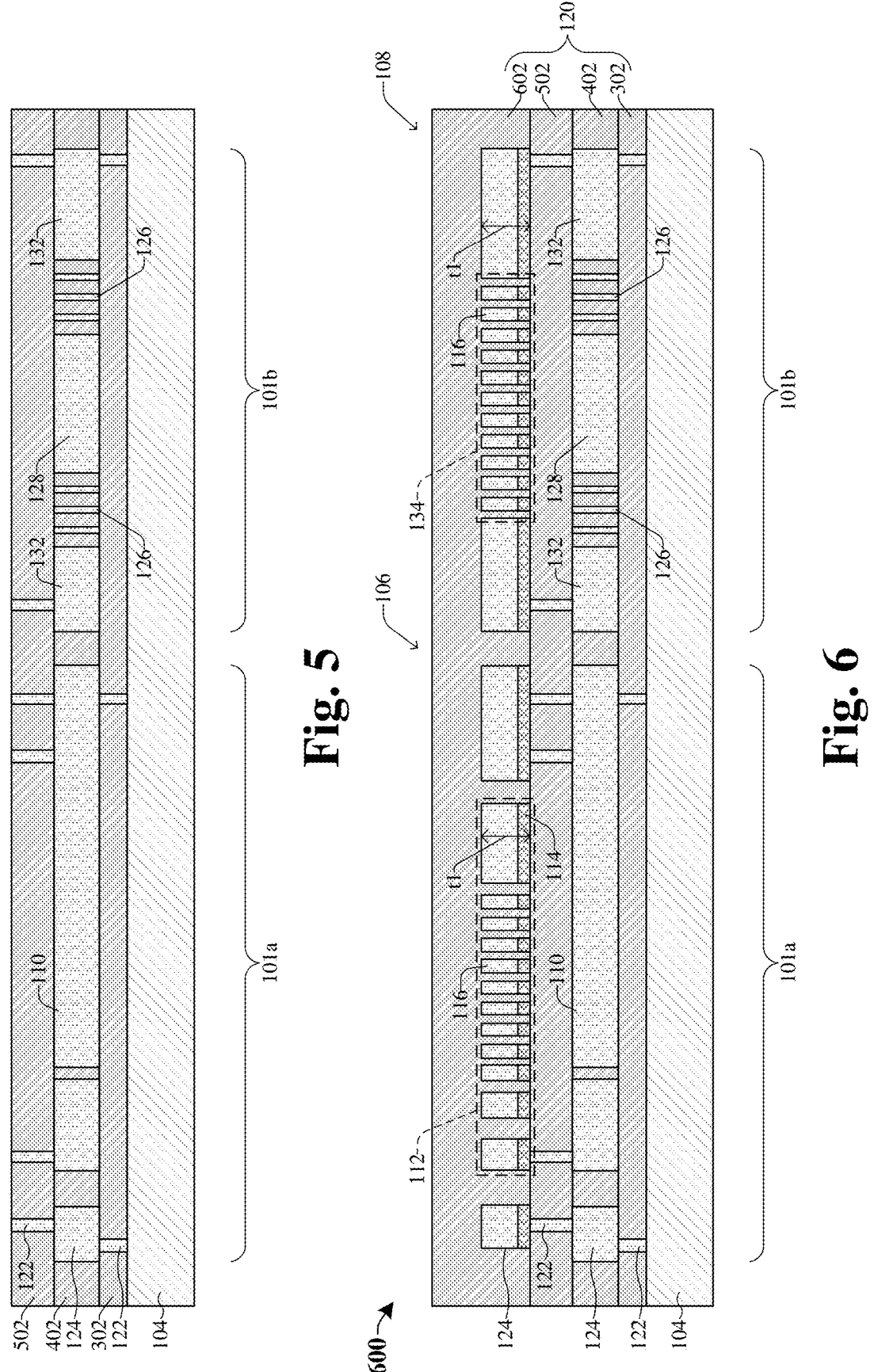

As shown in cross-sectional view 500 of FIG. 5, a third dielectric layer 502 is formed over the second dielectric layer 402 and a second layer of the plurality of conductive vias 122 is formed within the third dielectric layer 502. The third dielectric layer 502 may be deposited over the second dielectric layer 402 by CVD, PVD, ALD, or another suitable deposition or growth process. In some embodiments, a process for forming the second layer of the plurality of conductive vias 122 includes: forming a masking layer (not shown) over the third dielectric layer 502; patterning the third dielectric layer 502 according to the masking layer to define a plurality of via openings within the third dielectric layer 502; depositing a conductive material (e.g., polysilicon) within the via openings; and performing a planarization process (e.g., a CMP process) into the conductive material. In various embodiments, the conductive material is deposited by CVD, PVD, sputtering, electro plating, electroless plating, or another suitable deposition or growth process. In yet further embodiments, the planarization process may be performed such that a top surface of the third dielectric layer 502 and top surfaces of the conductive vias 122 in the second layer are co-planar.

As shown in cross-sectional view 600 of FIG. 6, a fourth dielectric layer 602, a second layer of the plurality of conductive wires 124, a first upper backplate 112, and a second upper backplate 134 are formed over the third dielectric layer 502, thereby defining a first MEMS device 106 within the first device region 101a and a second MEMS device 108 within the second device region 101b. The first upper backplate 112 is disposed within the first device region 101a and overlies the diaphragm 110, and the second upper backplate 134 is disposed within the second device region 101b and overlies the moveable element 128.

In various embodiments, a process for forming the second layer of the plurality of conductive wires 124, the first upper backplate 112, and the second upper backplate 134 includes: depositing (e.g., by CVD, PVD, sputtering, electroplating, electroless plating, etc.) an anti-stiction layer 114 over the third dielectric layer 502; depositing a conductive layer 116 over the anti-stiction layer 114; forming a masking layer (not shown) over the conductive layer 116; and patterning the anti-stiction layer 114 and the conductive layer 116 according to the masking layer to define the second layer of the plurality of conductive wires 124, the first upper backplate 112, and the second upper backplate 134. Further, the fourth dielectric layer 602 may be deposited over the first upper backplate 112 and the second upper backplate 134 by CVD, PVD, ALD, or another suitable growth or deposition process. In further embodiments, the first upper backplate 112 and the second upper backplate 134 may respectively be formed with a first thickness t1 that is within a range of about 0.1 micrometers (um) to about 1 um, less than about 1 um, or another suitable value. In some embodiments, the second layer of the plurality of conductive wires 124, the first upper backplate 112, and the second upper backplate 134 are formed concurrently with one another.

The anti-stiction layer 114 may, for example, be or comprise silicon nitride or another suitable material. The conductive layer 116 may, for example, be or comprise polysilicon, a piezoelectric material (e.g., aluminum nitride, PZT, etc.), or the like. In some embodiments, a process for forming the first MEMS device 106 and the second MEMS device 108 includes the processing steps illustrated and/or described in FIGS. 3-6. In various embodiments, the first MEMS device 106 may be formed concurrently with the second MEMS device 108, thereby reducing a number of processing steps utilized to form the first and second MEMS devices 106, 108. In yet further embodiments, the first dielectric layer 302, the second dielectric layer 402, the third dielectric layer 502, and the fourth dielectric layer 602 are part of a dielectric structure 120.

Figures 7, 8:
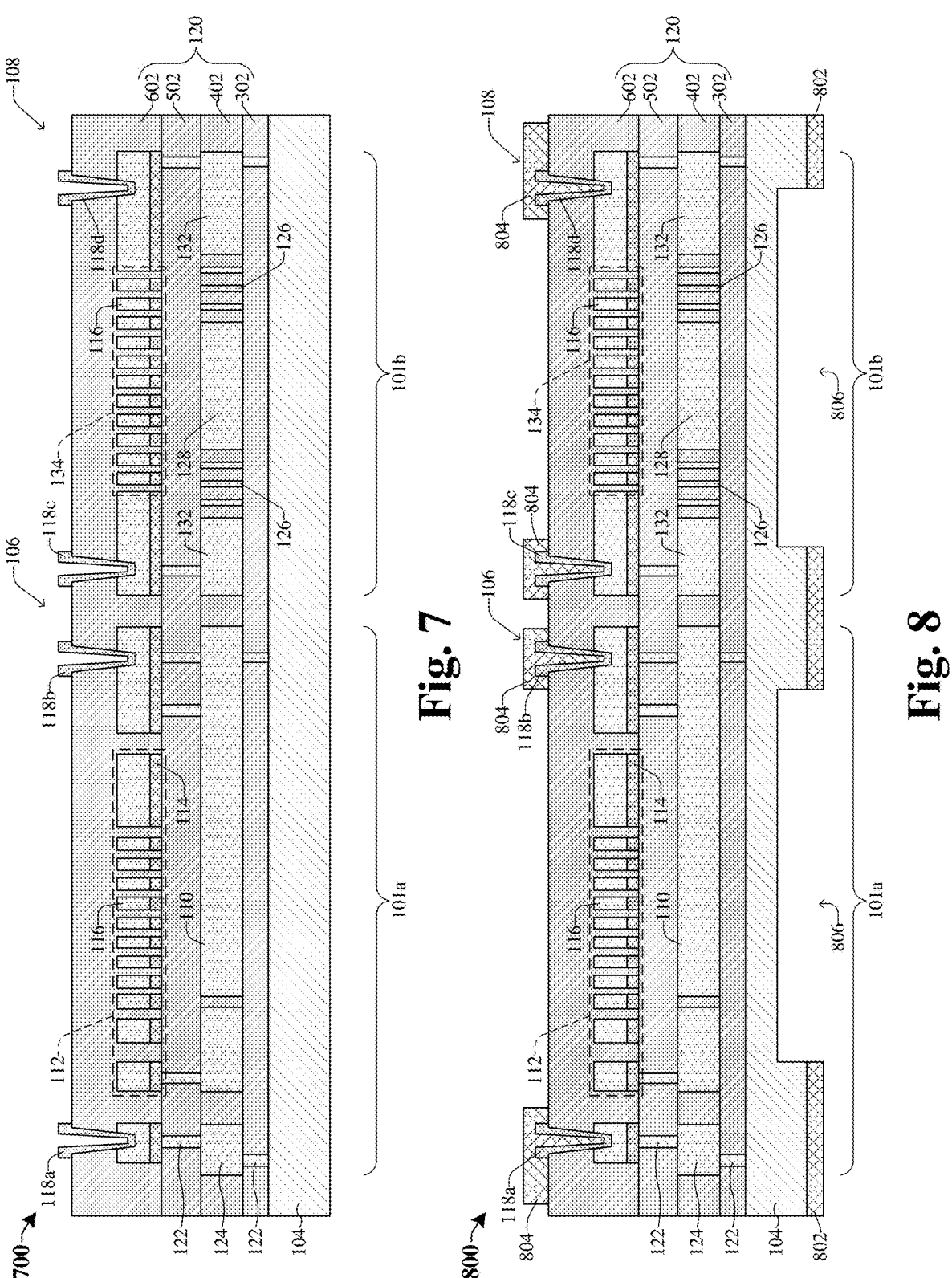

As shown in cross-sectional view 700 of FIG. 7, a plurality of electrical contacts 118a-d are formed within the dielectric structure 120 over the plurality of conductive wires 124. In various embodiments, the electrical contacts 118a-d may be formed by one or more depositions process (es), one or more patterning process(es), one or more planarization process(es), or other suitable processing steps. In various embodiments, the electrical contacts 118a-d may, for example, be or comprise aluminum, copper, titanium nitride, tungsten, gold, another suitable conductive material, or any combination of the foregoing.

As shown in cross-sectional view 800 of FIG. 8, a lower masking layer 802 is formed on a bottom surface of the semiconductor substrate 104 and an upper masking layer 804 is formed over the electrical contacts 118a-d. In addition, a first patterning process is performed on the semiconductor substrate 104 according to the lower masking layer 802, to form openings 806 within the semiconductor substrate 104. In various embodiments, the first patterning process includes performing a dry etching process, such as a plasma etching process and/or a deep reactive-ion etching (DRIE) process. The first patterning process defines a first opening directly under the diaphragm 110 within the first device region 101a and a second opening directly under the moveable element 128 and the spring structures 126 within the second device region 101b.

Figures 9, 10:
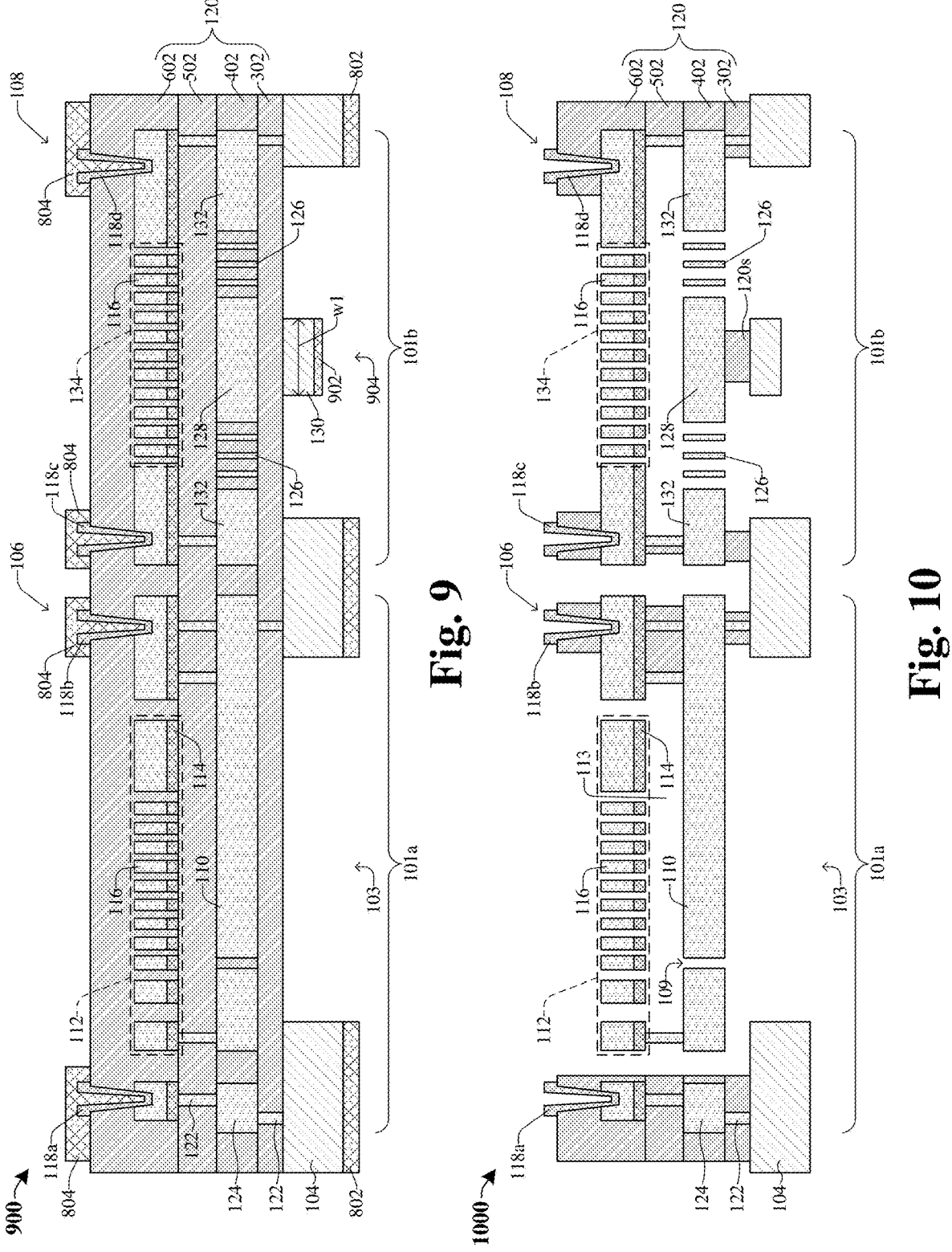

As shown in cross-sectional view 900 of FIG. 9, a second lower masking layer 902 is formed along a lower surface of the semiconductor substrate 104 and a second patterning process is performed on the semiconductor substrate 104 according to the lower masking layer 802 and the second lower masking layer 902. The second patterning process forms a substrate opening 103 within the semiconductor substrate 104 within the first device region 101*a*, and forms a proof mass 130 and opening within the second device region 101*b*. In various embodiments, the substrate opening 103 and the proof mass 130 are formed concurrently. In further embodiments, the second patterning process includes performing a dry etching process, such as a plasma etching process and/or a DRIE process. Further, the proof mass 130 is formed such that it has a first width w1 that is within a range of about 10 um to about 900 um, or another suitable value. In some embodiments, a process for forming the substrate opening 103 and the proof mass 130 includes the processing steps illustrated and/or described in FIGS. 8 and 9.

As shown in cross-sectional view 1000 of FIG. 10, a third patterning process is performed on the structure of FIG. 9 according to the lower masking layer (802 of FIG. 9), the upper masking layer (804 of FIG. 9), and the second lower masking layer (902 of FIG. 9). In some embodiments, the third patterning process includes performing a wet etching process and exposing the structure of FIG. 9 to one or more wet etchants. In various embodiments, the third patterning process removes portions of the dielectric structure 120, thereby defining the air volume space 113 between the diaphragm 110 and the first upper backplate 112. After performing the third patterning process, a removal process is performed to remove the lower masking layer (802 of FIG. 9), the upper masking layer (804 of FIG. 9), and the second lower masking layer (902 of FIG. 9).

Figure 11:
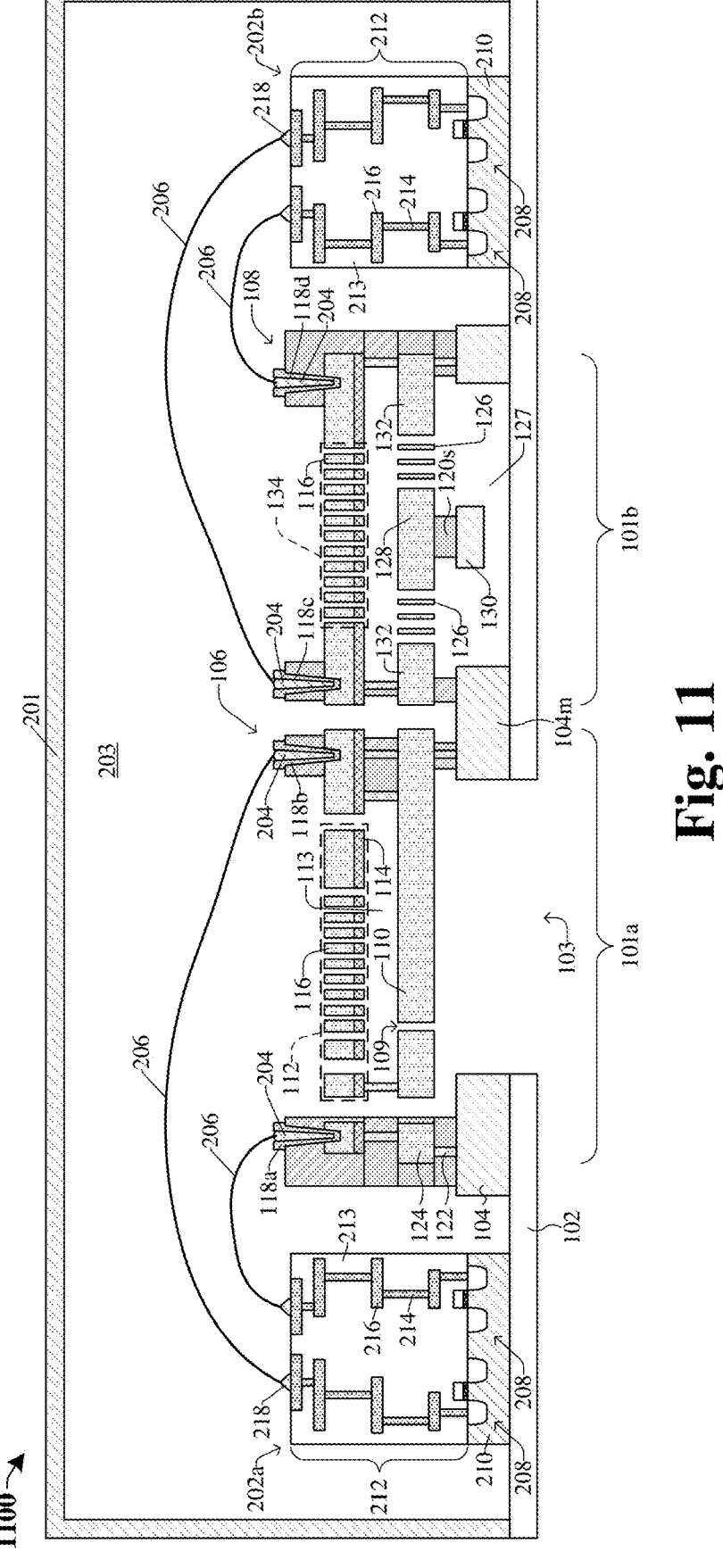

As shown in cross-sectional view 1100 of FIG. 11, the semiconductor substrate 104 is bonded to a support structure 102. In some embodiments, bonding the semiconductor substrate 104 to the support structure 102 includes performing a fusion bonding process or another suitable bonding process. Further, after performing the bonding process, the electrical contacts 118*a-d* are wire bonded to the first CMOS IC die 202*a* and the second CMOS IC die 202*b*. Subsequently, an enclosure structure 201 is formed over the support structure 102, thereby defining a package cavity 203. The enclosure structure 201 and the support structure 102 are part of a package structure. In some embodiments, an opening (i.e., an inlet) to the package structure may be the substrate opening 103, such that any air entering or leaving the package cavity 203 passes through the first MEMS device 106. By virtue of the first and second MEMS devices 106, 108 being formed concurrently along the semiconductor substrate 104, a number of processing steps utilized to form the structure of FIG. 11 is reduced. Further, a number of bonding processes utilized to form the second MEMS device 108 is reduced, thereby increasing a structural integrity of and reducing damage to the first and second MEMS devices 106, 108.

FIG. 12 illustrates a method 1200 of forming an electronic device having a first microelectromechanical system (MEMS) device and a second MEMS device disposed on a semiconductor substrate according to the present disclosure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a diaphragm, a moveable element, and spring structures are formed over a semiconductor substrate. FIG. 4 illustrates a cross-sectional view 400 corresponding to some embodiments of act 1202.

At act 1204, a first upper backplate is formed over the diaphragm and a second upper backplate is formed over the moveable element and the spring structures. FIG. 6 illustrates a cross-sectional view 600 corresponding to some embodiments of act 1204.

At act 1206, a dielectric structure is formed over the semiconductor substrate. FIGS. 3-6 illustrate cross-sectional views 300-600 corresponding to some embodiments of act 1206.

At act 1208, a plurality of electrical contacts are formed over the semiconductor substrate. FIG. 7 illustrates a cross-sectional view 700 corresponding to some embodiments of act 1208.

At act 1210, one or more patterning process(es) is/are performed on the semiconductor substrate to form a substrate opening under the diaphragm and to form a proof mass under the moveable element. FIGS. 8 and 9 illustrate cross-sectional views 800 and 900 corresponding to some embodiments of act 1210.

At act 1212, a patterning process is performed on the dielectric structure to define an air volume space around the first upper backplate, the second upper backplate, the diaphragm, the moveable element, and the spring structures. FIG. 10 illustrates a cross-sectional view 1000 corresponding to some embodiments of act 1212.

At act 1214, the semiconductor substrate is bonded to a support structure. FIG. 11 illustrates a cross-sectional view 1100 corresponding to some embodiments of act 1214.

At act 1216, the plurality of electrical contacts are wired bonded to a first complementary metal-oxide-semiconductor (CMOS) integrated circuit (IC) die and a second CMOS IC die. FIG. 11 illustrates a cross-sectional view 1100 corresponding to some embodiments of act 1216.

At act 1218, an enclosure structure is formed over the support structure, thereby defining a package cavity. FIG. 11 illustrates a cross-sectional view 1100 corresponding to some embodiments of act 1218.

Accordingly, in some embodiments, the present disclosure relates to forming a first MEMS device and a second MEMS device concurrently with one another over a semiconductor substrate, where the first MEMS device is different than the second MEMS device.

In some embodiments, the present application provides an electronic device including: a semiconductor substrate having a first surface opposite a second surface, wherein the semiconductor substrate at least partially defines a cavity; a first microelectromechanical systems (MEMS) device disposed along the first surface of the semiconductor substrate, wherein the first MEMS device comprises a first backplate and a diaphragm vertically separated from the first backplate; a second MEMS device disposed along the first surface of the semiconductor substrate, wherein the second MEMS device comprises spring structures and a moveable element, wherein the spring structures are configured to suspend the moveable element in the cavity; and wherein a segment of the semiconductor substrate continuously laterally extends from under a sidewall of the first MEMS device to under a sidewall of the second MEMS device.

In some embodiments, the present application provides an electronic device including: a first microelectromechanical systems (MEMS) device along a first surface of a semiconductor substrate, wherein the first MEMS device comprises a first backplate and a diaphragm vertically separated from the first backplate; and a second MEMS device disposed along the first surface of the semiconductor substrate, wherein the second MEMS device comprises spring structures, a moveable element, and a second backplate, wherein the second backplate is vertically separated from the moveable element and the spring structures, wherein a top surface of the first backplate is vertically aligned with a top surface of the second backplate.

In some embodiments, the present application provides a method for manufacturing an electronic device, the method including: providing a semiconductor substrate having a first surface opposite a second surface; forming a first microelectromechanical systems (MEMS) device along the first surface of the semiconductor substrate, wherein the first MEMS device comprises a first backplate and a diaphragm vertically separated from the first backplate; and forming a second MEMS device along the first surface of the semiconductor substrate, wherein the second MEMS device comprises spring structures and a moveable element, wherein the second MEMS device is laterally offset from the first MEMS device by a non-zero distance, wherein the first MEMS device and the second MEMS device are formed concurrently.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device comprising:
a semiconductor substrate having a first surface opposite a second surface, wherein the semiconductor substrate at least partially defines a cavity;
a first microelectromechanical systems (MEMS) device disposed along the first surface of the semiconductor substrate, wherein the first MEMS device comprises a first backplate and a diaphragm vertically separated from the first backplate;
a second MEMS device disposed along the first surface of the semiconductor substrate, wherein the second MEMS device comprises spring structures, a moveable element, and a second backplate over the spring structures and the moveable element, wherein the spring structures are configured to suspend the moveable element in the cavity, wherein an individual spring structure of the spring structures comprises two or more spring segments laterally offset from one another and spaced between the moveable element and an anchor structure, wherein the individual spring structure comprises sidewalls defining a plurality of first openings that extend through a thickness of the individual spring structure, wherein the plurality of first openings are arranged between and laterally separate adjacent spring segments in the two or more spring segments, wherein the second backplate comprises sidewalls defining a plurality of second openings extending through a thickness of the second backplate, wherein widths of the second openings are less than widths of the first openings; and
wherein a segment of the semiconductor substrate continuously laterally extends from under a sidewall of the first MEMS device to under a sidewall of the second MEMS device.

2. The electronic device of claim 1, wherein the semiconductor substrate comprises a proof mass disposed along the moveable element, wherein a sidewall of the moveable element faces the anchor structure, wherein a width of the proof mass is greater than a distance between the sidewall of the moveable element and the anchor structure.

3. The electronic device of claim 2, further comprising:
a dielectric structure disposed between the moveable element and the proof mass, wherein the dielectric structure directly contacts a bottom surface of the moveable element and directly contacts a top surface of the proof mass.

4. The electronic device of claim 2, wherein the semiconductor substrate and the proof mass comprise monocrystalline silicon, wherein the first backplate, the diaphragm, the spring structures, and the moveable element comprise polysilicon.

5. The electronic device of claim 1, further comprising:
a support structure disposed along the second surface of the semiconductor substrate, wherein the support structure comprises sidewalls defining a third opening, wherein the first MEMS device directly overlies the third opening, and wherein the second MEMS device is laterally offset from the third opening by a non-zero distance.

6. The electronic device of claim 5, further comprising:
an enclosure structure overlying the support structure, wherein the enclosure structure laterally surrounds the first and second MEMS devices.

7. The electronic device of claim 5, further comprising:
a first complementary metal-oxide-semiconductor (CMOS) integrated circuit (IC) die disposed over the support structure and wire bonded to the first MEMS device; and
a second CMOS IC die disposed over the support structure and wire bonded to the second MEMS device.

8. The electronic device of claim 7, wherein the semiconductor substrate is disposed laterally between the first CMOS IC die and the second CMOS IC die.

9. The electronic device of claim 1, wherein the thickness of the individual spring structure is greater than the thickness of the second backplate.

10. An electronic device comprising:
a first microelectromechanical systems (MEMS) device along a first surface of a semiconductor substrate, wherein the first MEMS device comprises a first backplate and a diaphragm vertically separated from the first backplate; and
a second MEMS device disposed along the first surface of the semiconductor substrate, wherein the second MEMS device comprises spring structures, a moveable element, and a second backplate, wherein the second backplate is vertically separated from the moveable element and the spring structures, wherein a top surface of the first backplate is vertically aligned with a top surface of the second backplate, wherein the first backplate and the second backplate have a first thickness, and wherein the diaphragm and the moveable element have a second thickness that is greater than the first thickness.

11. The electronic device of claim 10, wherein the first backplate and the second backplate respectively comprise a conductive layer overlying an anti-stiction layer, wherein the conductive layer comprises a first conductive material and the anti-stiction layer comprises a second conductive material different than the first conductive material.

12. The electronic device of claim 10, wherein the second MEMS device further comprises a pair of anchor structures spaced on opposing sides of the moveable element, wherein the spring structures continuously extend from a corresponding anchor structure to the moveable element.

13. The electronic device of claim 12, wherein a middle segment of the semiconductor substrate directly underlies an outer portion of the diaphragm, wherein an inner anchor structure of the pair of anchor structures directly overlies the middle segment.

14. The electronic device of claim 10, wherein the first MEMS device is configured as a microphone and the second MEMS device is configured as an accelerometer.

15. The electronic device of claim 10, wherein the semiconductor substrate continuously laterally extends from under a first outer sidewall of the first MEMS device to under a second outer sidewall of the second MEMS device.

16. An electronic device comprising:

a diaphragm overlying a first surface of a semiconductor substrate;

a first backplate overlying the diaphragm, wherein a vertical distance between a top surface of the diaphragm and a bottom surface of the first backplate is greater than a thickness of the first backplate;

a plurality of conductive vias arranged between the diaphragm and the first backplate, wherein the plurality of conductive vias and the diaphragm comprise a first material;

a moveable element overlying the first surface of the semiconductor substrate and laterally offset from the diaphragm by a non-zero distance; and a spring structure laterally extending from an anchor structure to the moveable element, wherein the anchor structure is spaced laterally between the moveable element and the diaphragm, wherein a top surface of the anchor structure is aligned with the top surface of the diaphragm.

17. The electronic device of claim 16, wherein an outer edge of the diaphragm directly overlies a first side of a segment of the semiconductor substrate and an outer edge of the anchor structure directly overlies a second side of the segment of the semiconductor substrate.

18. The electronic device of claim 16, further comprising:

a second backplate overlying the moveable element, wherein a top surface of the second backplate is aligned with a top surface of the first backplate.

19. The electronic device of claim 16, wherein the semiconductor substrate comprises a first pair of opposing sidewalls defining a first opening under the diaphragm and a second pair of opposing sidewalls defining at least a portion of a cavity, wherein the moveable element is disposed within the cavity.

20. The electronic device of claim 16, wherein a thickness of the anchor structure is equal to a thickness of the diaphragm.

* * * * *